United States Patent
Ban et al.

(10) Patent No.: US 10,250,334 B2
(45) Date of Patent: Apr. 2, 2019

(54) OPTICAL RECEIVER MODULE AND OPTICAL MODULE

(71) Applicant: Oclaro Japan, Inc., Sagamihara, Kanagawa (JP)

(72) Inventors: Takuma Ban, Kanagawa (JP); Kazuhiro Komatsu, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/919,279

(22) Filed: Mar. 13, 2018

(65) Prior Publication Data

US 2018/0269986 A1   Sep. 20, 2018

(30) Foreign Application Priority Data

Mar. 14, 2017 (JP) .................. 2017-048567

(51) Int. Cl.
*H04B 10/06* (2006.01)
*H04B 10/69* (2013.01)
(Continued)

(52) U.S. Cl.
CPC ........... *H04B 10/69* (2013.01); *G02B 6/4215* (2013.01); *G02B 6/4246* (2013.01);
(Continued)

(58) Field of Classification Search
CPC ...... H04B 10/40; H04B 10/43; H04B 10/697; H04B 10/69; H04B 10/801; H04B 10/60;
(Continued)

(56) References Cited

U.S. PATENT DOCUMENTS

| 6,538,790 B1 | 3/2003 | Hatakeyama et al. |
| 8,936,405 B2 * | 1/2015 | Tamura ............ H01L 23/66 385/88 |

(Continued)

FOREIGN PATENT DOCUMENTS

| JP | 2000-082806 A | 3/2000 |
| JP | 2003-014994 A | 1/2003 |

(Continued)

OTHER PUBLICATIONS

M. Shishikura et al., "10-Gbit/s per channel parallel optical transmitter and receiver module for high-capacity interconnects," The 53th Electronic Components and Technology Conference, 2003, pp. 1040-1045.

*Primary Examiner* — Hanh Phan
(74) *Attorney, Agent, or Firm* — Mattingly & Malur, PC

(57) ABSTRACT

An optical receiver module includes light-receiving elements each having a first electrode and a second electrode to which a bias is applied, and converting input optical signals into electric signals and outputting the electric signals from the first electrodes, and a carrier having wiring patterns respectively electrically connecting to the light-receiving elements and supporting the light-receiving elements. The wiring pattern includes a first wiring line electrically connecting to the first electrode and a second wiring line electrically connecting to the second electrode. The second wiring line has a high resistance portion having a higher resistance value than the other portions at least in a position overlapping with the light-receiving element to be connected and a low resistance portion having a lower resistance value than the high resistance portion at least in a position not overlapping with any of the light-receiving elements.

12 Claims, 8 Drawing Sheets

(51) Int. Cl.
*H04B 10/80* (2013.01)
*H03F 3/08* (2006.01)
*G02B 6/42* (2006.01)

(52) U.S. Cl.
CPC ........... *G02B 6/4274* (2013.01); *H03F 3/087* (2013.01); *H04B 10/80* (2013.01); *G02B 6/4212* (2013.01); *G02B 6/4292* (2013.01)

(58) Field of Classification Search
CPC .. H03F 3/08; G02B 6/12; G02B 6/122; G02B 6/4284
USPC ....... 398/202, 208, 209, 212, 210, 213, 214, 398/135, 136, 137, 138, 139, 158, 159, 398/164; 385/88, 89, 90, 92, 93; 250/214 A, 214 LA, 214 R
See application file for complete search history.

(56) References Cited

U.S. PATENT DOCUMENTS

| | | | |
|---|---|---|---|
| 9,998,234 B2 * | 6/2018 | Kaikkonen | ............ H04B 10/40 |
| 2012/0170944 A1 * | 7/2012 | Yagisawa | ........... H04B 10/6911 |
| | | | 398/200 |
| 2015/0136957 A1 | 5/2015 | Lemura et al. | |
| 2015/0270814 A1 * | 9/2015 | Ban | .......................... H03F 3/08 |
| | | | 250/214 A |

FOREIGN PATENT DOCUMENTS

| | | |
|---|---|---|
| JP | 2014-192510 A | 10/2014 |
| JP | 2015-096878 A | 5/2015 |

* cited by examiner

OPTICAL RECEIVER MODULE AND OPTICAL MODULE

CROSS-REFERENCE TO RELATED APPLICATION

The present application claims priority from Japanese application JP2017-048567 filed on Mar. 14, 2017, the content of which is hereby incorporated by reference into this application.

BACKGROUND OF THE INVENTION

1. Field of the Invention

This invention relates to an optical receiver module and an optical module.

2. Description of the Related Art

With downsizing and higher functionality of optical receiver modules, an optical receiver module in a form housing a plurality of light-receiving elements in a single package has come into use (JP 2015-96878 A). With downsizing of the optical receiver module, the plurality of light-receiving elements have been adjacently arranged. For example, a light-receiving element array in which the plurality of light-receiving elements are integrated on the same substrate is used. The plurality of light-receiving elements are junction-down mounted on a submount. On the submount, anode wires (signal wires) and cathode wires (bias wires) corresponding to the respective light-receiving elements are provided. The anode wires and the cathode wires are connected to an integrated circuit or the like including an amplifier (JP 2014-192510 A).

Recently, with further downsizing, electric crosstalk between the adjacent light-receiving elements or wires has become a problem (JP 2000-82806 A, JP 2003-14994 A, and M. Shishikura et al., "10-Gbit/s per channel parallel optical transmitter and receiver module for high-capacity interconnects," Proc. The 53th Electronic Components and Technology Conference, pp. 1040-1045 (2003)). High-frequency characteristics are deteriorated due to crosstalk. Particularly, the light-receiving elements are formed using a material having a higher dielectric constant (a semiconductor material such as InP, GaAs, or SiGe) compared to the air and become a factor of a capacitance component. The light-receiving elements that are preferably electrically independent from one another in a normal situation are located close to one another, and thereby, the adjacent wires cause electrical coupling via the light-receiving elements and characteristic deterioration.

SUMMARY OF THE INVENTION

An object of the invention is to effectively absorb crosstalk noise.

(1) An optical receiver module according to the invention includes a plurality of light-receiving elements each having a first electrode and a second electrode to which a bias is applied, and converting input optical signals into electric signals and outputting the electric signals from the first electrodes, and a carrier having wiring patterns respectively electrically connecting to the plurality of light-receiving elements and supporting the plurality of light-receiving elements so that the first electrodes and the second electrodes may face the wiring patterns, wherein the wiring pattern includes a first wiring line electrically connecting to the first electrode and a second wiring line electrically connecting to the second electrode, and the second wiring line has a high resistance portion having a higher resistance value than the other portions at least in a position overlapping with the light-receiving element to be connected and a low resistance portion having a lower resistance value than the high resistance portion at least in a position not overlapping with any of the plurality of light-receiving elements.

According to the invention, the high resistance portion of the second wiring line is provided at least in the position overlapping with the light-receiving element to be connected, i.e., the position close to the light-receiving element, and thereby, crosstalk noise may be effectively absorbed.

(2) In the optical receiver module according to (1), the second wiring line may also have the low resistance portion in the position overlapping with the light-receiving element to be connected.

(3) In the optical receiver module according to (1) or (2), the second wiring line may include a pair of second wiring lines, each of the pair of second wiring lines may have the high resistance portion, and the first wiring line may be provided between the pair of second wiring lines.

(4) In the optical receiver module according to (3), the resistance values of the high resistance portions of the respective pair of second wiring lines may be nearly the same.

(5) In the optical receiver module according to any one of (1) to (4), the second wiring lines respectively connected to the plurality of light-receiving elements may be adjacent to the second wiring lines connected to the adjacent light-receiving elements.

(6) In the optical receiver module according to (1) or (2), the second wiring lines respectively connected to the plurality of light-receiving elements may be adjacent to the first wiring lines connected to the adjacent light-receiving elements.

(7) In the optical receiver module according to any one of (1) to (6), the plurality of light-receiving elements may be integrally integrated in a single chip.

(8) In the optical receiver module according to any one of (1) to (6), the plurality of light-receiving elements may be a plurality of chips individually separated.

(9) In the optical receiver module according to any one of (1) to (8), the carrier may be a single carrier that integrally supports the plurality of light-receiving elements.

(10) In the optical receiver module according to any one of (1) to (9), an amplifier for applying a voltage for applying the bias to the respective plurality of light-receiving elements, and amplifying input of the electric signals from the respective plurality of light-receiving elements is provided.

(11) An optical module according to the invention includes an optical receiver subassembly containing the optical receiver module according to any one of (1) to (10) and an optical transmitter subassembly that outputs an optical signal converted from an input electric signal.

DETAILED DESCRIPTION OF THE INVENTION

As below, embodiments of the invention will be explained with reference to the drawings. Note that, regarding the drawings, the same or equal elements have the same signs and overlapping description will be omitted.

First Embodiment

Figure 1:
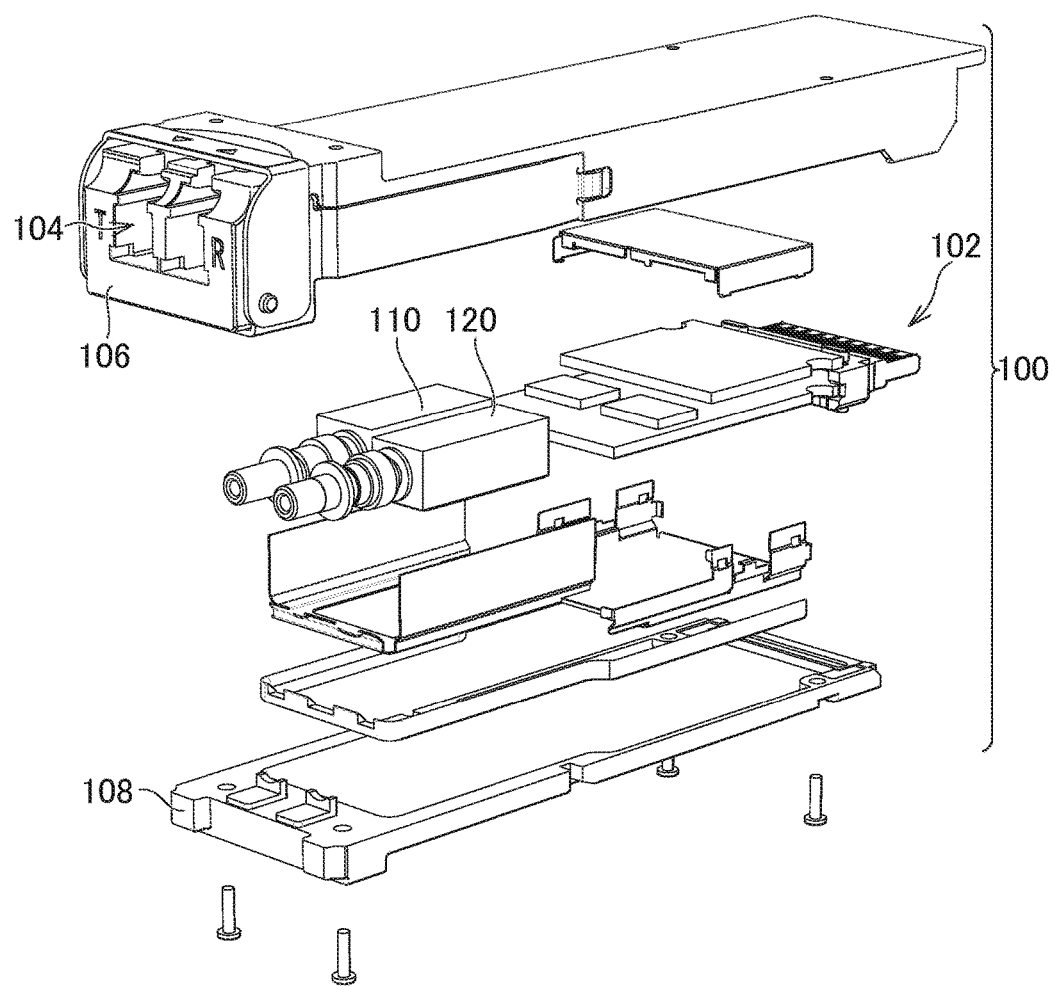
FIG. 1 is an exploded perspective view of an optical module according to the first embodiment to which the invention is applied.

FIG. 1 is an exploded perspective view of an optical module according to the first embodiment to which the invention is applied. An optical module 100 has an optical transmitter subassembly 110 (TOSA: Transmitter Optical Sub-Assembly) for converting an electric signal into an optical signal and an optical receiver subassembly 120 (ROSA: Receiver Optical Sub-Assembly) for converting an optical signal into an electric signal. On the transmission side, an electric signal sent from a host board (not shown) is converted into an optical signal through a circuit within the optical module 100 via an electrical interface 102 and transmitted from an optical interface 104. On the reception side, the optical signal is received and an electric signal is output to a host-side board (not shown). The optical module 100 has cases 106, 108 as a pair of half cases and electronic components are housed inside thereof.

Figure 2:
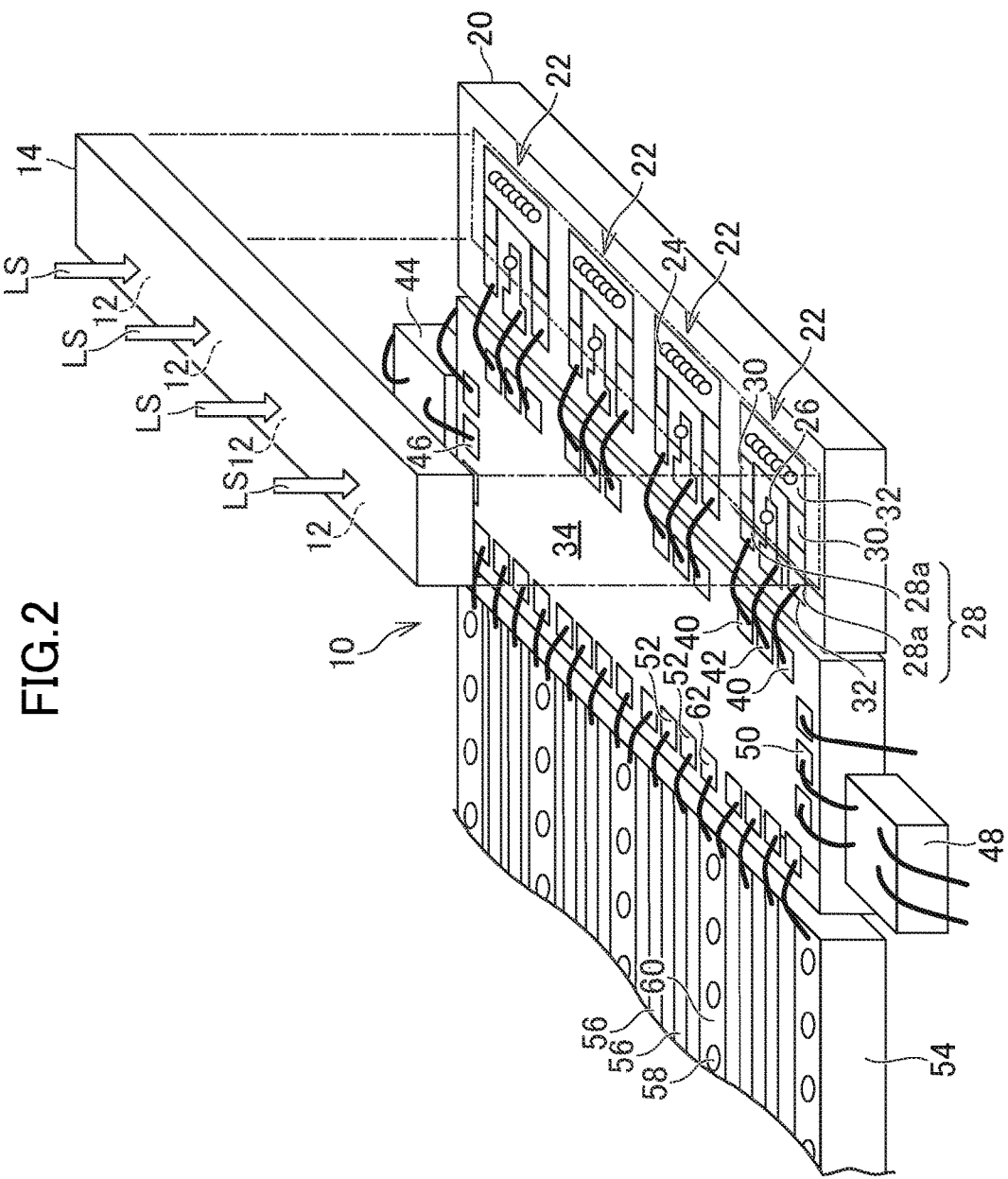
FIG. 2 is a partially exploded perspective view of an optical receiver module according to the first embodiment to which the invention is applied.

FIG. 2 is a partially exploded perspective view of an optical receiver module according to the first embodiment to which the invention is applied. An optical receiver module 10 shown in FIG. 2 is provided within the optical receiver subassembly 120 shown in FIG. 1. The optical receiver module 10 includes a chip 14 (PD (Photodiode) array or the like) in which a plurality of light-receiving elements 12 are integrally integrated.

Figure 3:
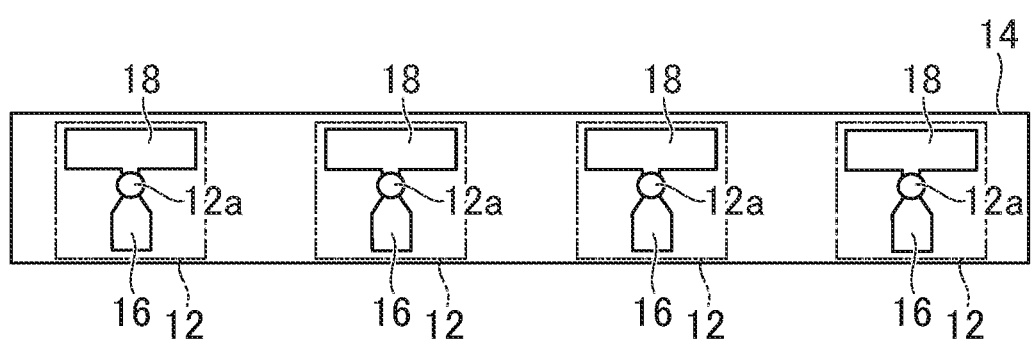
FIG. 3 shows a bottom surface of a chip having a plurality of light-receiving elements.

FIG. 3 shows a bottom surface of the chip 14 having the plurality of light-receiving elements 12. The optical receiver module 10 has the light-receiving elements 12 (e.g. photodiodes). Optical signals LS (see FIG. 2) enter the optical receiver subassembly 120, are collected by lenses (not shown), and enter the light-receiving elements 12. The light-receiving elements 12 are back-illuminated light-receiving elements into which the optical signals LS enter from the opposite sides to the surfaces on which light-receiving portions (absorption layers) 12a are formed.

The light-receiving element 12 has a first electrode 16 and a second electrode 18 to which a bias is applied on the bottom surface in the example of FIG. 3. The light-receiving element 12 converts the optical signal LS input from the light-receiving portion 12a into an electric signal and outputs an electric signal ES (see FIG. 4) from the first electrode 16. The light-receiving element 12 is an InP-based semiconductor device having a PN junction, and the side connecting to the p-type semiconductor may be referred to as "anode" and the side connecting to the n-type semiconductor may be referred to as "cathode". That is, the first electrode 16 and the second electrode 18 may be referred to as "anode" and "cathode", respectively. In other words, the p-type semiconductor side may be referred to as "signal electrode" and the n-type semiconductor side may be referred to as "bias electrode". Note that the names "anode" and "cathode" may be for convenience sake and vice versa. That is, the names "anode" and "cathode" here show that the light-receiving element 12 has two electrodes (the first electrode 16 and the second electrode 18) having different polarity (different potential differences).

As shown in FIG. 2, the optical receiver module 10 has a carrier 20. The carrier 20 is a single carrier that integrally supports the plurality of light-receiving elements 12 (chip 14). The carrier 20 has wiring patterns 22 corresponding to the respective light-receiving elements 12. The wiring patterns 22 electrically connect to the light-receiving elements 12. For electrical connection, in the bonding process of the chip 14, solder balls 24 are used. Note that not only the solder balls but also any members that provide electrical connection between the wiring patterns 22 and the light-receiving elements 12 may be appropriately selected. The carrier 20 supports the plurality of light-receiving elements 12 (chip 14) so that the first electrodes 16 and the second electrodes 18 may face the wiring patterns 22.

The wiring pattern 22 includes a first wiring line 26 that electrically connects to the first electrode 16. The wiring pattern 22 includes a second wiring line 28 electrically connecting to the second electrode 18. The second wiring line 28 includes a pair of second wiring lines 28a. The first wiring line 26 is provided between the pair of second wiring lines 28a. The second wiring lines 28 respectively connected to the plurality of light-receiving elements 12 are adjacent to the second wiring lines 28 connected to the adjacent light-receiving elements 12. That is, regarding the wiring patterns 22 adjacent to each other, the respective second wiring lines 28 are adjacent to each other.

The second wiring line 28 has high resistance portions 30 having higher resistance values than the other portions at least in positions overlapping with the light-receiving element 12 to be connected. The high resistance portions 30 are formed from a material having a larger electrical resistance such as a compound of Ni and Cr, a compound of Ta and N, Ti, or Mo. The respective pair of second wiring lines 28a have the high resistance portions 30. Note that it is preferable that the two high resistance portions 30 have nearly equal resistance values. Further, the second wiring line 28 has low resistance portions 32 having lower resistance values than the high resistance portions 30 at least in positions not overlapping with any of the plurality of light-receiving elements 12. The low resistance portions 32 may be formed using a material having a smaller electrical resistance (e.g. Au, aluminum, platinum, silver, or the like). The second wiring line 28 also has the low resistance portion 32 in a position overlapping with the light-receiving element 12 to be connected.

Note that the high resistance portion 30 may be formed by a high resistance layer and the low resistance portion 32 may be formed by a stacking structure of a low resistance layer and a high resistance layer. For example, a film of a material having a larger electrical resistance may be patterned to be continuously left in the high resistance portions 30 and the low resistance portions 32 and the low resistance portions 32 may be plated by a metal having a smaller electrical resistance.

The optical receiver module 10 has an amplifier 34 such as a preamplifier, limiting amplifier, auto gain controller or transimpedance amplifier. Electric power is supplied from an external power source 36 (see FIG. 4) to the amplifier 34. For example, the electric power is supplied from an external power supply line (not shown) through a plate capacitor 44 and a power supply pad 46 to an amplifier circuit 38 (see FIG. 4) of the amplifier 34 by wires. A voltage for application of a bias is supplied from the amplifier 34 to the light-receiving elements 12. For example, the voltage is applied from an external power supply line (not shown) through a plate capacitor 48 to a power supply pad 50 of the amplifier 34 by wires. The voltage is also supplied from the external power source 36 (see FIG. 4). Note that the light-receiving elements 12 and the amplifier 34 may be connected to separate power sources.

The amplifier 34 has the amplifier circuit 38 (see FIG. 4) such as an operational amplifier and amplifies the electric signals ES output from the light-receiving elements 12. The amplifier 34 has amplifier-side bias pads 40 and amplifier-side signal pads in which the voltages of the bias to be supplied to the light-receiving elements 12 appear. The amplifier-side signal pads 42 also serve to input the electric signals ES (see FIG. 4) to the amplifier 34. The amplifier-side bias pads 40 and the amplifier-side signal pads 42 are provided directly on the amplifier 34.

The first wiring line 26 and the amplifier-side signal pad 42 are connected by a wire. The amplifier 34 amplifies and outputs the electric signal ES input from the amplifier-side signal pad 42 to output pads 52. For differential output, pairs of the output pads 52 are provided. The differentially output electric signals ES are output to outside through signal patterns 56 on a printed wiring board 54. GND patterns 60 having through holes 58 are provided on the printed wiring board 54 and connected to GND pads 62 of the amplifier 34.

Figure 4:
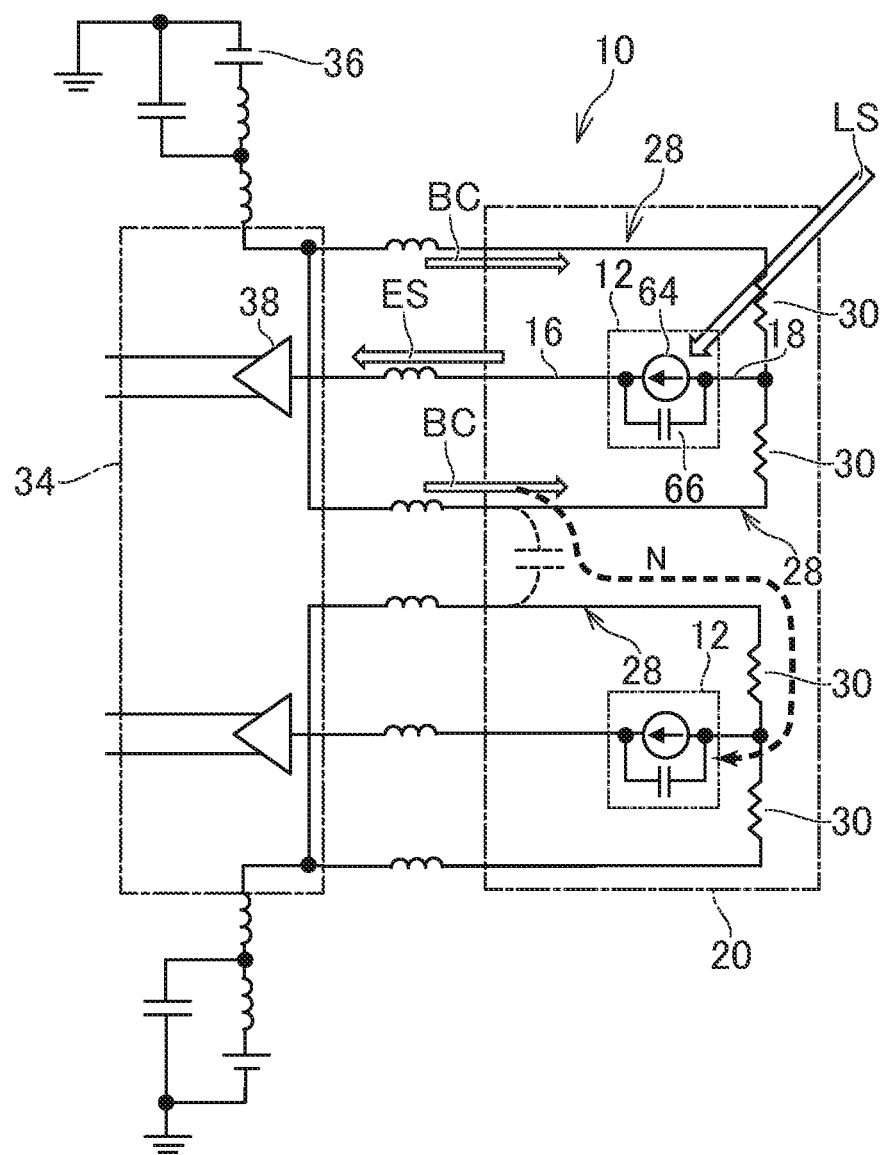
FIG. 4 shows an equivalent circuit of the optical receiver module shown in FIG. 2.

FIG. 4 shows an equivalent circuit of the optical receiver module 10 shown in FIG. 2. In FIG. 4, the other configurations than the light-receiving elements 12 and the amplifier 34 are simplified. The light-receiving element 12 may be regarded as an element having a current source 64 that pushes out a current proportional to the received light, an internal capacitance 66, and an internal resistance (not shown).

In the embodiment, a positive voltage is applied to the second electrode 18 on the side in contact with the n-type semiconductor (inversely biased). Note that many semiconductor light-receiving elements 12 are used by application of a bias voltage in the same direction as that of the embodiment, however, the positive or negative direction of the voltage is not particularly limited, but may be appropriately selected depending on the light-receiving elements 12 in use.

The power is supplied to the current source 64 from the external power source 36 from the second wiring line 28 via a wire. Filters or the like are often provided in the bias lines within the amplifier 34, and their routing method or the like is different depending on the manufacturers of the amplifier 34.

When the optical signal LS is input to the light-receiving element 12, the electric signal ES proportional to the received light is generated. The electric signal ES is input to the amplifier circuit 38 within the amplifier 34 through the amplifier-side signal pads 42 (see FIG. 2) via wires.

A bias current BC flows in the second wiring line 28, and crosstalk occurs in the adjacent second wiring lines 28 respectively connected to the adjacent light-receiving elements 12 due to mutual inductance and floating capacity. Particularly, when the modulation frequency of the electric signal ES is higher, the crosstalk is remarkable. The adjacent light-receiving elements 12 are formed by semiconductors and have higher dielectric constants compared to the air, and electrical coupling is easily generated via the semiconductor regions between the adjacent second wiring lines 28. Particularly, when the plurality of light-receiving elements 12 are closely arranged as those in the embodiment, the electrical coupling is stronger. That is, weak crosstalk noise N is generated in the second wiring lines 28 depending on the frequencies and intensity of the electric signals ES. The crosstalk noise N flows into the adjacent second wiring line 28 via the adjacent light-receiving element 12 (chip 14), passes through the second electrodes 18, passes through the current sources 64, and is input to the amplifier circuits 38. Therefore, the electric signals ES output from the amplifier circuits 38 through the output pads 52 are signals containing noise components. Note that the noise components are referred to as crosstalk noise here, however, the bias currents BC themselves may fluctuate due to the high frequency components of the electric signals ES and the fluctuation components may be noise sources. The noise also flows into the adjacent light-receiving elements 12 by the above described mechanism and causes adverse effect. Crosstalk may occur between the adjacent light-receiving elements 12 due to some other factors.

Accordingly, in the embodiment, the high resistance portions 30 of the second wiring lines 28 are provided at least in the positions overlapping with the light-receiving elements 12 to be connected (see FIG. 2), i.e., the positions close to the light-receiving elements 12. Thereby, the crosstalk noise N is effectively absorbed. More specifically, as described above, the electrical coupling may occur between the adjacent second wiring lines 28 via the light-receiving elements 12 (chip 14). That is, the crosstalk is generated more strongly in the regions with the light-receiving elements 12 than the regions without the light-receiving elements 12 of the second wiring lines 28. The noise N generated by crosstalk reduces the noise N generated before superimposed on the electric signals ES, and thereby, the quality of the electric signals ES may be kept. Accordingly, it is preferable that the high resistance portions 30 for reducing (absorbing) the crosstalk noise N are located near the regions where crosstalk is generated, i.e., close to the light-receiving elements 12. Therefore, the high resistance portions 30 located in the positions overlapping with the light-receiving elements 12 have strong effect. If the regions of the high resistance portions 30 are too large, the original biases themselves are reduced. Accordingly, it is preferable that the regions have appropriate sizes that may overlap with the light-receiving elements 12. Note that all of the high resistance portions 30 may be located in the positions overlapping with the light-receiving elements 12, however, the effect may be obtained when part of the portions are located in positions not overlapping with the elements.

Second Embodiment

Figure 5:
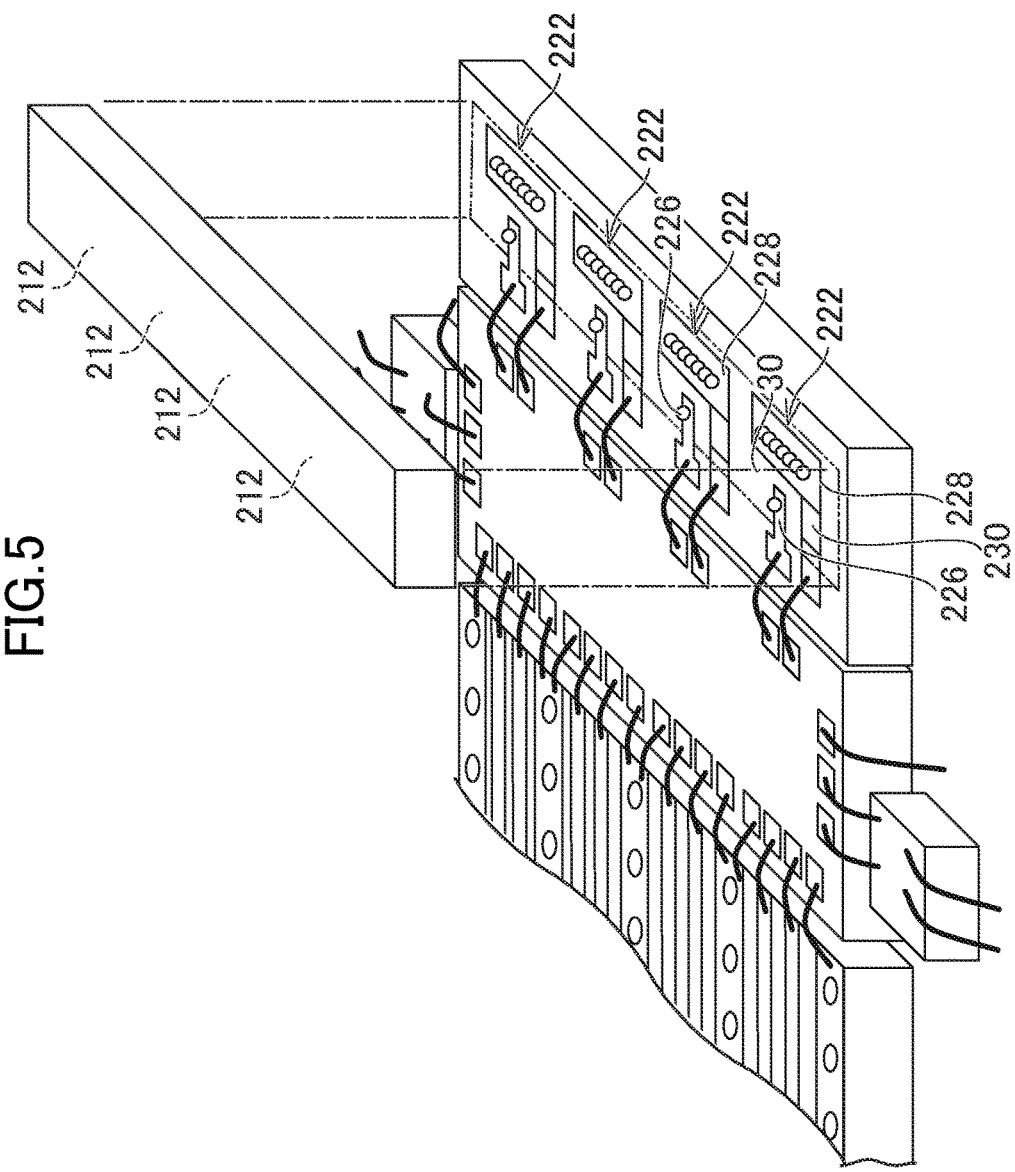
FIG. 5 is a partially exploded perspective view of an optical receiver module according to the second embodiment to which the invention is applied.

FIG. 5 is a partially exploded perspective view of an optical receiver module according to the second embodiment to which the invention is applied. In this example, a wiring pattern 222 corresponding to each light-receiving element 212 includes a single second wiring line 228. Further, the second wiring lines 228 respectively connected to a plurality of the light-receiving elements 212 are adjacent to first wiring lines 226 connected to the adjacent light-receiving elements 212. Accordingly, the first wiring lines 226 and the second wiring lines 228 generate crosstalk due to mutual inductance and floating capacity. The other details correspond to the details explained in the first embodiments.

Figure 6:
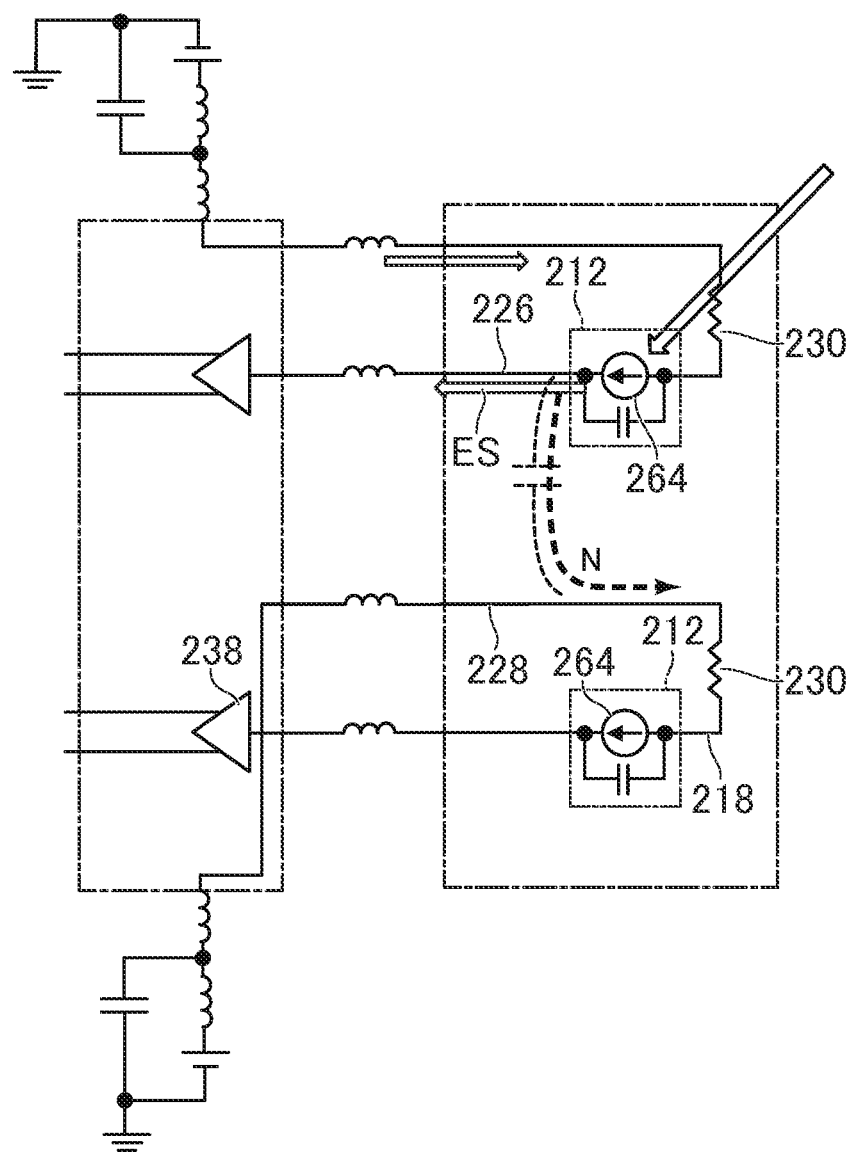
FIG. 6 shows an equivalent circuit of the optical receiver module shown in FIG. 5.

FIG. 6 shows an equivalent circuit of the optical receiver module shown in FIG. 5. In this example, by electric signals ES transmitted by the first wiring lines 26, crosstalk noise N is superimposed on the second wiring line 228 connected to the adjacent light-receiving element 212. The crosstalk noise N passes through a second electrode 218, passes through a current source 264, and is input to an amplifier circuit 238. Therefore, the electric signal ES output from the adjacent amplifier circuit 238 is a signal containing a noise component. Accordingly, also, in the embodiment, high resistance portions 230 of the second wiring lines 228 are provided at least in positions overlapping with the light-receiving elements 212 to be connected, i.e., positions close to the light-receiving elements 212. Thereby, the crosstalk noise N is effectively absorbed.

Third Embodiment

Figure 7:
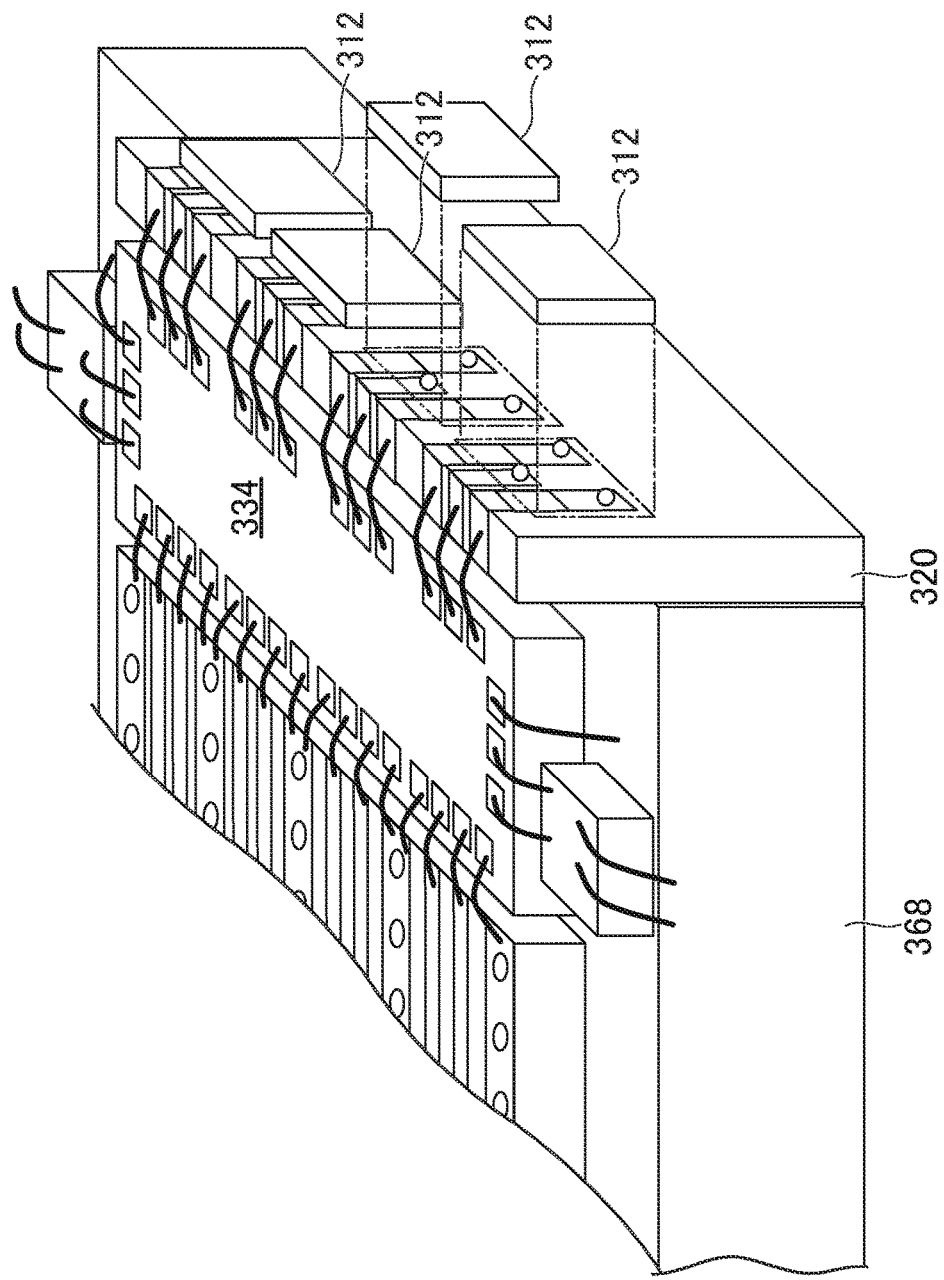
FIG. 7 is a partially exploded perspective view of an optical receiver module according to the third embodiment to which the invention is applied.

FIG. 7 is a partially exploded perspective view of an optical receiver module according to the third embodiment to which the invention is applied. In the embodiment, a plurality of light-receiving elements 312 are a plurality of chips individually separated.

An amplifier 334 is mounted on an upper surface of a substrate 368, a carrier 320 is longitudinally attached to a side end surface of the substrate 368, and the plurality of light-receiving elements 312 are mounted on the carrier 320. The other details correspond to the details explained in the first embodiment. Even when the plurality of light-receiving elements are not integrated in the same semiconductor substrate as in the embodiment, crosstalk noise N may occur between the adjacent light-receiving elements and effects may be obtained in a recent optical receiver module with compact high-density packaging.

Fourth Embodiment

Figure 8:
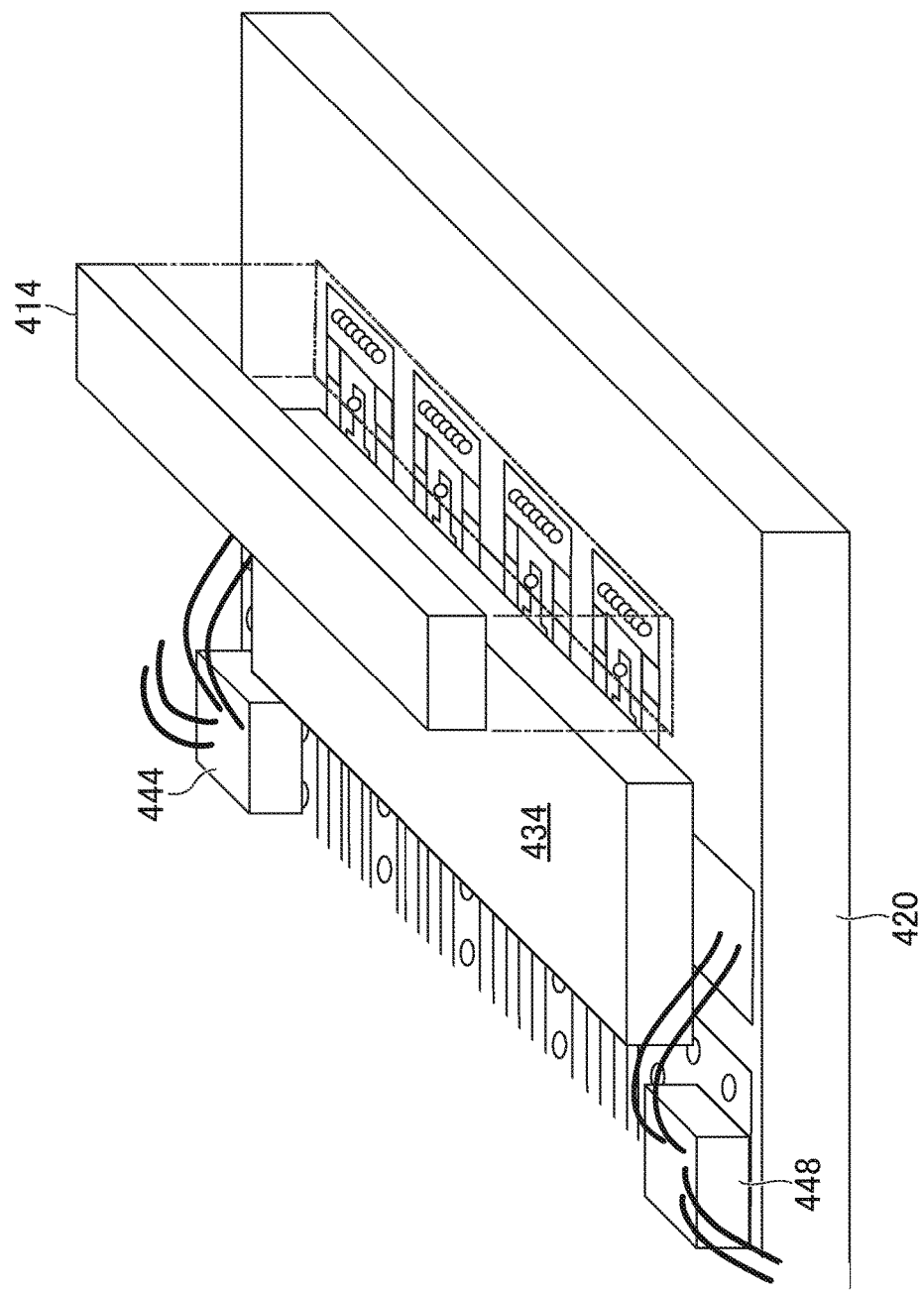
FIG. 8 is a partially exploded perspective view of an optical receiver module according to the fourth embodiment to which the invention is applied.

FIG. 8 is a partially exploded perspective view of an optical receiver module according to the fourth embodiment to which the invention is applied. In this example, a carrier 420 having a structure in which the carrier 20 and the printed wiring board 54 shown in FIG. 2 are integrated is used. On the carrier 420, a chip 414 containing a plurality of light-receiving elements, an amplifier 434, and plate capacitors 444, 448 are mounted. The other details correspond to the details explained in the first embodiment.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical receiver module comprising:
    a plurality of light-receiving elements, each having a first electrode and a second electrode to which a bias is applied, configured to convert input optical signals into electric signals and output the electric signals from the first electrodes; and
    a carrier having a plurality of wiring patterns, each electrically connecting to a respective light-receiving element of the plurality of light-receiving elements, that support the plurality of light-receiving elements so that the first electrodes and the second electrodes face the wiring patterns,
    wherein each of the wiring patterns includes a first wiring line electrically connecting to the first electrode and a second wiring line electrically connecting to the second electrode of the respective light-receiving element,
    the second wiring line has a high resistance portion having a higher resistance value than other portions at least in a position overlapping with the respective light-receiving element connected thereto, the high resistance portion and the other portions of the second wiring line being connected in series, and
    the second wiring line has a low resistance portion having a lower resistance value than the high resistance portion at least in a position not overlapping with any of the plurality of light-receiving elements.

2. The optical receiver module according to claim 1, wherein the second wiring line also has the low resistance portion in the position overlapping with the respective light-receiving element connected thereto.

3. The optical receiver module according to claim 1, wherein the second wiring lines respectively connected to the plurality of light-receiving elements are adjacent to the second wiring lines connected to the adjacent light-receiving elements.

4. The optical receiver module according to claim 1, wherein the second wiring lines respectively connected to the plurality of light-receiving elements are adjacent to the first wiring lines connected to the adjacent light-receiving elements.

5. The optical receiver module according to claim 1, wherein the plurality of light-receiving elements are integrated in a single chip.

6. The optical receiver module according to claim 1, wherein the plurality of light-receiving elements are a plurality of chips individually separated.

7. The optical receiver module according to claim 1, wherein the carrier is a single carrier that integrally supports the plurality of light-receiving elements.

8. The optical receiver module according to claim 1, further comprising:
    an amplifier configured to apply a voltage as the bias to the respective plurality of light-receiving elements, and to amplify the electric signals from the respective plurality of light-receiving elements.

9. An optical module comprising:
    an optical receiver subassembly containing the optical receiver module according to claim 1; and
    an optical transmitter subassembly that outputs an optical signal converted from an input electric signal.

10. An optical receiver module comprising:
    a plurality of light-receiving elements, each having a first electrode and a second electrode to which a bias is applied, configured to convert input optical signals into electric signals and output the electric signals from the first electrodes; and
    a carrier having a plurality of wiring patterns, each electrically connecting to a respective light-receiving element of the plurality of light-receiving elements, that support the plurality of light-receiving elements so that the first electrodes and the second electrodes face the wiring patterns,
    wherein each of the wiring patterns includes a first wiring line electrically connecting to the first electrode and a second wiring line electrically connecting to the second electrode of the respective light-receiving element, the second wiring line has a high resistance portion having a higher resistance value than other portions at least in a position overlapping with the respective light-receiving element connected thereto and a low resistance portion having a lower resistance value than the high resistance portion at least in a position not overlapping with any of the plurality of light-receiving elements, the second wiring line includes a pair of second wiring lines, each of the pair of second wiring lines has the high resistance portion, and the first wiring line is provided between the pair of second wiring lines.

11. The optical receiver module according to claim 10, wherein the resistance values of the high resistance portions of the respective pair of second wiring lines are nearly the same.

12. An optical module comprising:

an optical receiver subassembly containing the optical receiver module according to claim 10; and an optical transmitter subassembly that outputs an optical signal converted from an input electric signal.

* * * * *